US011002695B2

(12) United States Patent
Rong et al.

(10) Patent No.: US 11,002,695 B2
(45) Date of Patent: May 11, 2021

(54) MAGNETIC RESONANCE SPECTROMETER AND CONTROL APPARATUS FOR MAGNETIC RESONANCE SPECTROMETER BASED ON FPGA

(71) Applicant: University of Science and Technology of China, Hefei (CN)

(72) Inventors: Xing Rong, Hefei (CN); Zhifu Shi, Hefei (CN); Xi Qin, Hefei (CN); Yijin Xie, Hefei (CN); Lin Wang, Hefei (CN); Zhen Jiang, Hefei (CN); Jiangfeng Du, Hefei (CN)

(73) Assignee: University of Science and Technology of China, Hefei (CN)

( * ) Notice: Subject to any disclaimer, the term of this patent is extended or adjusted under 35 U.S.C. 154(b) by 324 days.

(21) Appl. No.: 16/097,772

(22) PCT Filed: May 5, 2016

(86) PCT No.: PCT/CN2016/081119
§ 371 (c)(1),
(2) Date: Mar. 11, 2019

(87) PCT Pub. No.: WO2017/190307
PCT Pub. Date: Nov. 9, 2017

(65) Prior Publication Data
US 2020/0003713 A1 Jan. 2, 2020

(51) Int. Cl.
*G01N 24/10* (2006.01)
*G01R 33/60* (2006.01)

(52) U.S. Cl.
CPC ............. *G01N 24/10* (2013.01); *G01R 33/60* (2013.01)

(58) Field of Classification Search
CPC .... G01N 24/10; G01R 33/60; G01R 33/3621; G01R 33/3607; G01R 33/62;
(Continued)

(56) References Cited

U.S. PATENT DOCUMENTS

2010/0260293 A1 10/2010 Roeven
2014/0097842 A1 4/2014 Yang et al.
(Continued)

FOREIGN PATENT DOCUMENTS

CN 1361418 A 7/2002
CN 101896832 A 11/2010
(Continued)

OTHER PUBLICATIONS

X. Li, G. Torfs, S. Teughels and J. Bauwelinck, "First demonstration of RF pulse pEPR detection system for SPIO nanoparticles," in Electronics Letters, vol. 51, No. 19, pp. 1486-1488, Sep. 17, 2015 (Year: 2015).*
(Continued)

*Primary Examiner* — Daniel R Miller
(74) *Attorney, Agent, or Firm* — Wolf, Greenfield & Sacks, P.C.

(57) ABSTRACT

A magnetic resonance spectrometer and a control apparatus for the magnetic resonance spectrometer based on an FPGA. The control apparatus includes a control unit and a conversion receiving unit. The control unit includes a clock source. A waveform generation unit and a signal receiving unit inside the control apparatus are synchronized by means of the same clock source. The control apparatus includes two working modes: a continuous wave mode and an impulse wave mode. The control apparatus can output a microwave signal which is modulated by any wave and has higher synchronism and time resolution.

12 Claims, 7 Drawing Sheets

(58) Field of Classification Search
CPC .............. G01R 33/5601; G01R 33/281; G01R 33/345; G01R 33/445; G01R 33/24; G01R 33/341; G01R 33/38; G01R 33/31; G01R 33/34053; G01R 33/381; G01R 33/448; G01R 33/343; G01R 33/465; G01R 33/3806; G01R 33/26; G01R 33/282; G01R 33/3415; G01R 33/385; A61B 5/055

See application file for complete search history.

(56) References Cited

U.S. PATENT DOCUMENTS

| | | | | |
|---|---|---|---|---|
| 2016/0097832 | A1* | 4/2016 | Suzuki | G01R 33/3621 324/316 |
| 2016/0149566 | A1* | 5/2016 | Sun | G06F 1/04 713/300 |
| 2018/0031500 | A1* | 2/2018 | Verbiest | G01R 33/281 |

FOREIGN PATENT DOCUMENTS

| | | |
|---|---|---|
| CN | 102508180 A | 6/2012 |
| EP | 2256651 A2 | 12/2010 |
| WO | WO 2014/210268 A1 | 12/2014 |

OTHER PUBLICATIONS

X. Yang, P. Seifi and A. Babakhani, "A single-chip dual-mode CW/pulse electron paramagnetic resonance spectrometer in 0.13 μm SiGe BiCMOS," 2013 IEEE MTT-S International Microwave Symposium Digest (MTT), Seattle, WA, 2013, pp. 1-4 (Year: 2013).*
C. Chen, P. Seifi and A. Babakhani, "A silicon-based, fully integrated pulse electron paramagnetic resonance system for mm-wave spectroscopy," 2013 IEEE MTT-S International Microwave Symposium Digest (MTT), Seattle, WA, 2013, pp. 1-3 (Year: 2013).*
PCT/CN2016/081119, Feb. 4, 2017, International Search Report.
EP16900829.9, Dec. 11, 2019, Extended European Search Report.
Extended European Search Report for European Application No. 16900829.9, dated Dec. 11, 2019.
[No Author Listed] System on a chip. Wikipedia. https://en.wikipedia.org/w/index.php?title=System_on_a_chip&oldid=715852623. Last edited Apr. 18, 2016; last accessed Dec. 2, 2019, 4 pages.
[No Author Listed] Field-programmable gate array. Wikipedia https://en.wikipedia.org/w/index.php?title=Field-programmable_gate_array_&oldid=717443634. Last edited Apr. 27, 2016; last accessed Dec. 2, 2019, 13 pages.
Shi et al., An X-band pulsed electron paramagnetic resonance spectrometer with time resolution improved by a field-programmable-gate-array based pulse generator. Review of Scientific Instruments. Dec. 10, 2018;89(12):125104.
International Search Report dated Feb. 4, 2017 in connection with International Application No. PCT/CN2016/081119.
Sun et al., Design and implementation of an FPGA-based timing pulse programmer for pulsed-electro paramagnetic resonance applications. Concepts Magn Reson Part B Magn Reson Eng. Aug. 1, 2013; 43(3): 100-109. doi:10.1002/cmr.b.21240. Author's Manuscript available in PMC Aug. 1, 2014. 16 pages.

* cited by examiner

MAGNETIC RESONANCE SPECTROMETER AND CONTROL APPARATUS FOR MAGNETIC RESONANCE SPECTROMETER BASED ON FPGA

This Application is a national stage filing under 35 U.S.C. § 371 of International Patent Application Serial No. PCT/CN2016/081119, filed May 5, 2016. The entire content of this application is incorporated herein by reference in its entirety.

FIELD

The present disclosure relates to the technical field of automatic control, and in particular to a magnetic resonance spectrometer and an FPGA based control device for the magnetic resonance spectrometer.

BACKGROUND

The Electron Paramagnetic Resonance (EPR) technology is a spectra method for detecting unpaired electron characteristics in samples, which is widely applied in fields of chemistry, physics, material engineering, environment science, life science and medicine. An electron paramagnetic resonance spectrometer used in paramagnetic resonance experiments normally operates in a pulse mode and a continuous wave mode.

In the electron paramagnetic resonance technology, a microwave signal in a continuous wave form or a pulse wave form is usually used to excite electron spin, and quantum state of the electron spin is measured by means of electronics readout. The microwave signals are mainly generated by an arbitrary waveform generator, a square wave generator and other necessary microwave devices, and the electronics readout is mainly performed by a data acquisition unit based on a high-speed analog-to-digital conversion technology.

The electronic paramagnetic resonance spectrometer having both the pulse mode and the continuous wave mode according to the conventional technology usually includes an arbitrary waveform generator, a square wave generator and a data acquisition unit, which operate independently and are separately controlled by host computer software. In this design, each of the components uses its own clock reference source and achieves synchronization through asynchronous triggering, resulting in poor synchronicity of the spectrometer. Therefore it is difficult to apply the spectrometer in applications requiring a higher temporal resolution. In addition, since the system includes a variety of devices, the system has a low integration degree and a high cost, and is complicated in both software and hardware, resulting in difficulties in debugging and maintenance.

Therefore, how to improve the temporal resolution and the integration degree of the paramagnetic resonance spectrometer and achieve high design flexibility is a difficult problem in the art.

SUMMARY

In order to solve the above technical problem, a magnetic resonance spectrometer and an FPGA based control device for the magnetic resonance spectrometer are provided according to the present disclosure. The control device has high synchronization, which can improve the temporal resolution of the magnetic resonance spectrometer, and also has a high integration degree and high design flexibility.

In order to achieve the above technical object, the following technical solution is provided according to embodiments of the present disclosure.

An FPGA based control device for a magnetic resonance spectrometer is applied to an electron paramagnetic resonance spectrometer. The electron paramagnetic resonance spectrometer includes: a host computer, a microwave transceiver and a sample chamber. The microwave transceiver includes a microwave switch. The control device includes a control unit and a conversion receiving unit. The control unit includes a clock source.

The control unit is configured to receive waveform data and a control instruction which are transmitted by the host computer, generate an operation clock signal based on a clock signal generated by the clock source, and select a preset operation mode of the control device according to the control instruction, where the preset operation mode includes a continuous wave mode and a pulse mode.

In a case that the control device is in the pulse mode, the control unit generates a first digital signal based on the waveform data transmitted by the host computer in response to triggering by the operation clock signal. The conversion receiving unit is configured to receive the first digital signal, and process, in response to the triggering by the operation clock signal, a first microwave signal generated by the microwave transceiver by using the first digital signal to generate a second microwave signal, and transmit the second microwave signal to the sample chamber to excite a sample in the sample chamber to generate a third microwave signal that carries sample information; the conversion receiving unit is further configured to receive the third microwave signal, convert the third microwave signal to a second digital signal that carries the sample information and return the second digital signal to the control unit, the control unit is further configured to transmit the second digital signal to the host computer, for the host computer to obtain the sample information.

In a case that the control device is in the continuous wave mode, the control unit controls the conversion receiving unit to generate a reference signal and controls the microwave transceiver to transmit the first microwave signal to the sample chamber to excite the sample in the sample chamber to generate a fourth microwave signal that carries sample information. The conversion receiving unit is further configured to receive the fourth microwave signal modulated by the reference signal, convert the fourth microwave signal modulated by the reference signal to a third digital signal that carries the sample information and return the third digital signal to the control unit, the control unit is configured to transmit the third digital signal to the host computer, for the host computer to obtain the sample information.

The control unit is arranged in Field-Programmable Gate Array, FPGA.

Preferably, in a case that the control device is in the pulse mode, the waveform data is pulse waveform data, the second microwave signal and the third microwave signal are pulse microwave signals.

Preferably, the conversion receiving unit includes a waveform conversion unit and a signal receiving unit.

In a case that the control device is in the pulse mode, the waveform conversion unit is configured to receive the first digital signal, process the first microwave signal generated by the microwave transceiver by using the first digital signal to generate the second microwave signal in response to the triggering by the operation clock signal. The second microwave signal excites the sample in the sample chamber to generate the third microwave signal that carries the sample information.

The signal receiving unit is configured to receive the third microwave signal in the form of the pulse microwave signal, convert the third microwave signal to the second digital signal that carries the sample information, and return the second digital signal to the control unit. The control unit transmits the second digital signal that carries the sample information to the host computer, for the host computer to obtain the sample information.

Preferably, the control device further includes a control clock management unit.

The control clock management unit is configured to receive the operation clock signal outputted from the control unit, adjust a frequency and a drive capability of the operation clock signal, and transmit the adjusted operation clock signal to the waveform conversion unit and the signal receiving unit.

Preferably, in a case that the control device is in the continuous wave mode, the fourth microwave signal is a continuous microwave signal.

Preferably, the conversion receiving unit includes a waveform conversion unit and a signal receiving unit.

In a case that the control device is in the continuous wave mode, the microwave transceiver transmits a continuous microwave signal to the sample chamber. The continuous microwave signal excites the sample in the sample chamber to generate the fourth microwave signal in the form of the continuous microwave signal that carries the sample information.

The signal receiving unit transmits a reference signal under control of the control unit. The signal receiving unit is configured to receive the fourth microwave signal in the form of the continuous microwave signal that carries the sample information and that is modulated by the reference signal, convert the fourth microwave signal to the third digital signal that carries the sample information and return the third digital signal to the control unit. The control unit transmits the third digital signal that carries the sample information to the host computer, for the host computer to obtain the sample information.

Preferably, the control device further includes a storage unit, and the preset operation mode further includes a storage mode.

In a case that the control device is in the storage mode, the control unit transmits the waveform data transmitted by the host computer to the storage unit for storage.

Preferably, in a case that the control device is in the pulse mode, the control unit is configured to read the waveform data transmitted by the host computer from the storage unit, and process the waveform data to generate the first digital signal.

Preferably, the preset operation mode further includes a square wave mode.

In a case that the control device is in the square wave mode, the control unit generates a first square wave signal based on the waveform data transmitted by the host computer in response to the triggering by the operation clock signal.

The conversion receiving unit is configured to receive the first square wave signal and perform level adjustment on the first square wave signal to obtain a second square wave signal, and output the second square wave signal to the microwave switch of the microwave transceiver. The second square wave signal drives the microwave switch to generate a microwave pulse signal. The microwave pulse signal excites the sample in the sample chamber to generate a fourth microwave signal that carries the sample information. After receiving the fourth microwave signal, the signal receiving unit converts the fourth microwave signal to a fourth digital signal that carries the sample information and returns the fourth digital signal to the control unit. The control unit transmits the fourth digital signal that carries the sample information to the host computer, for the host computer to obtain the sample information.

A magnetic resonance spectrometer includes at least one control device according to any one the embodiments described above.

It can be seen from the above technical solution that a magnetic resonance spectrometer and an FPGA based control device for a magnetic resonance spectrometer are provided according to the embodiments of the present disclosure. The control device includes: a control unit and a conversion receiving unit. A clock source is integrated in the control unit. The control unit is configured to generate an operation clock signal based on a clock signal generated by the clock source and receive waveform data and a control instruction transmitted by a host computer, select a preset operation mode of the control device according to the control instruction, where the preset operation mode includes a continuous wave mode and a pulse mode. In a case that the control device is in the pulse mode, the control unit generates a first digital signal based on the waveform data transmitted by the host computer in response to triggering by the operation clock signal. The conversion receiving unit is configured to receive the first digital signal, and process, in response to the triggering by the operation clock signal, a first microwave signal generated by the microwave transceiver by using the first digital signal to generate a second microwave signal and transmit the second microwave signal to the sample chamber so as to excite a sample in the sample chamber to generate a third microwave signal that carries sample information. The conversion receiving unit is further configured to receive the third microwave signal and convert the third microwave signal to a second digital signal that carries the sample information and return the second digital signal to the control unit such that the control unit transmits the second digital signal to the host computer, for the host computer to obtain the sample information. In a case that the control device is in the continuous wave mode, the control unit is configured to control the conversion receiving unit to generate a reference signal and control the microwave transceiver to transmit a first microwave signal to the sample chamber to excite the sample in the sample to chamber to generate a fourth microwave signal that carries sample information. The conversion receiving unit is further configured to receive the fourth microwave signal modulated by the reference signal, convert the fourth microwave signal modulated by the reference signal to a third digital signal that carries the sample information and return the third digital signal to the control unit such that the control unit transmits the third digital signal to the host computer, for the host computer to obtain the sample information. It can be known from the above operation process that the control unit generates the operation clock signals through the same clock source. The control unit and the conversion receiving unit control the electron paramagnetic resonance spectrometer in response to triggering by the operation clock signals from the same clock source. Since the operation clock signals from the same clock source are highly synchronized, the control device has higher synchronization than an electron paramagnetic resonance spectrometer including multiple separated clock sources according to the conventional technology. The higher synchronization of the control device leads to small minimum resolvable time width of a pulse width and a pulse relative delay of the second microwave signal in the form of the pulse generated by the electronic paramagnetic resonance spectrometer, i.e., a high temporal resolution of the second microwave signal, under control of the control device.

BRIEF DESCRIPTION OF THE DRAWINGS

The drawings to be used in the description of the embodiments or the conventional technology are described briefly as follows, so that the technical solutions according to the embodiments of the present disclosure or according to the conventional technology become clearer. It is apparent that the drawings in the following description only illustrate some embodiments of the present disclosure. For those skilled in the art, other drawings may be obtained according to these drawings without any creative work.

DETAILED DESCRIPTION OF EMBODIMENTS

Figure 1:
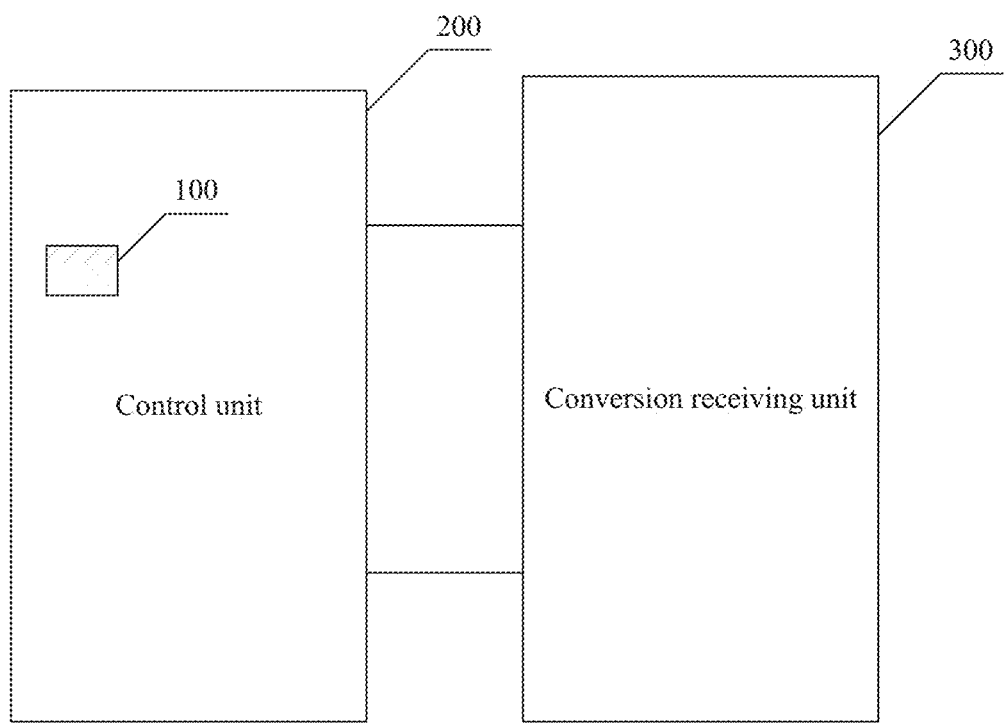
FIG. 1 is a schematic structural diagram of a FPAG based control device for a magnetic resonance spectrometer according to an embodiment of the present disclosure.

As described in the background, an electronic paramagnetic resonance spectrometer according to the conventional technology usually includes an arbitrary waveform generator, a square wave generator and a data acquisition unit, which operate independently to achieve generation of the microwave and data acquisition, and are separately controlled by host computer software. In this design, each of the components uses its own clock reference source and achieves synchronization through asynchronous triggering, resulting in poor synchronicity of the spectrometer. Therefore it is difficult to apply the spectrometer in applications requiring a higher temporal resolution. In addition, since the system includes a variety of devices, the system has a low integration degree and a high cost, and is complicated in both software and hardware, resulting in difficulties in debugging and maintenance.

In view of this, an FPGA based control device for a magnetic resonance spectrometer is provided according to an embodiment of the present disclosure, which is applied to an electronic paramagnetic resonance spectrometer. The electron paramagnetic resonance spectrometer includes: a host computer, a microwave transceiver and a sample chamber. The control device includes a control unit and a conversion receiving unit. The control unit includes a clock source.

The control unit is configured to receive waveform data and a control instruction which are transmitted by the host computer, generate an operation clock signal based on a clock signal generated by the clock source, and select a preset operation mode of the control device according to the control instruction, where the preset operation mode includes a continuous wave mode and a pulse mode.

In a case that the control device is in the pulse mode, the control unit is configured to generate a first digital signal based on the waveform data transmitted by the host computer in response to triggering by the operation clock signal. The conversion receiving unit is configured to receive the first digital signal, and process, in response to the triggering by the operation clock signal, a first microwave signal generated by the microwave transceiver by using the first digital signal to generate a second microwave signal, and transmit the second microwave signal to the sample chamber so as to excite a sample in the sample chamber to generate a third microwave signal that carries sample information. The conversion receiving unit is further configured to receive the third microwave signal, convert the third microwave signal to a second digital signal that carries the sample information and return the second digital signal to the control unit such that the control unit transmits the second digital signal to the host computer, for the host computer to obtain the sample information.

In a case that the control device is in the continuous wave mode, the control unit is configured to control the conversion receiving unit to generate a reference signal and controls the microwave transceiver to transmit the first microwave signal to the sample chamber to excite a sample in a sample chamber to generate a fourth microwave signal that carries sample information. The conversion receiving unit is further configured to receive the fourth microwave signal modulated by the reference signal, convert the fourth microwave signal modulated by the reference signal to a third digital signal that carries the sample information and return the third digital signal to the control unit such that the control unit transmits the third digital signal to the host computer, for the host computer to obtain the sample information.

The control unit is arranged in a Field-Programmable Gate Array (FPGA).

It can be seen from the above technical solution that a magnetic resonance spectrometer and an FPGA based control device for a magnetic resonance spectrometer are provided according to the embodiments of the present disclosure. The control device includes: a control unit and a conversion receiving unit. A clock source is integrated in the control unit. The control unit is configured to receive waveform data and a control instruction which are transmitted by the host computer, generate an operation clock signal based on a clock signal generated by the clock source and select a preset operation mode of the control device according to the control instruction, where the preset operation mode includes a continuous wave mode and a pulse mode. In a case that the control device is in the pulse mode, the control unit is configured to generate a first digital signal based on the waveform data transmitted by the host computer in response to triggering by the operation clock signal. The conversion receiving unit is configured to receive the first digital signal. The conversion receiving unit is further configured to process, in response to the triggering by the operation clock signal, a first microwave signal generated by the microwave transceiver by using the first digital signal to generate a second microwave signal and transmit the second microwave signal to the sample chamber so as to excite a sample in the sample chamber to generate a third microwave signal that carries sample information. The conversion receiving unit is further configured to receive the third microwave signal, convert the third microwave signal to a second digital signal that carries the sample information and return the second digital signal to the control unit such that the control unit transmits the second digital signal to the host computer, for the host computer to obtain the sample information. In a case that the control device is in the continuous wave mode, the control unit is configured to control the conversion receiving unit to generate a reference signal and control the microwave transceiver to transmit a first microwave signal to the sample chamber to excite the sample in the sample chamber to generate a fourth microwave signal that carries sample information. The conversion receiving unit is further configured to receive the fourth microwave signal modulated by the reference signal, convert the fourth microwave signal modulated by the reference signal to a third digital signal that carries the sample information and return the third digital signal to the control unit such that the control unit transmits the third digital signal to the host computer, for the host computer to obtain the sample information. It can be known from the above operation process that the control unit generates the operation clock signals through the same clock source. The control unit and the conversion receiving unit control the electron paramagnetic resonance spectrometer in response to triggering by the operation clock signals from the same clock source. Since the operation clock signals from the same clock source are highly synchronized, the control device has higher synchronization than an electron paramagnetic resonance spectrometer including multiple separated clock sources according to the conventional technology. Under control of the control device, the second microwave signal in the form of pulse generated by the electronic paramagnetic resonance spectrometer has a high temporal resolution of a pulse width and a pulse relative delay.

The technical solutions according to the embodiments of the present disclosure are described clearly and completely in conjunction with the drawings hereinafter. It is apparent that the described embodiments are only a few rather than all of the embodiments according to the present disclosure. Any other embodiments obtained by those skilled in the art based on the embodiments of the present disclosure without any creative work fall within the scope of protection of the present disclosure.

An FPGA based control device for a magnetic resonance spectrometer is provided according to an embodiment of the present disclosure, which is applied to an electronic paramagnetic resonance spectrometer. The electron paramagnetic resonance spectrometer includes: a host computer, a microwave transceiver and a sample chamber. As shown in FIG. 1, the control device includes a control unit 200 and a conversion receiving unit 300. The control unit 200 includes a clock source 100.

The control unit 200 is configured to receive waveform data and a control instruction which are transmitted by the host computer, generate an operation clock signal based on a clock signal generated by the clock source 100, and select a preset operation mode of the control device according to the control instruction, where the preset operation mode includes a continuous wave mode and a pulse mode.

In a case that the control device is in the pulse mode, the control unit 200 generates a first digital signal based on the waveform data transmitted by the host computer in response to triggering by the operation clock signal. The conversion receiving unit 300 is configured to receive the first digital signal; and process, in response to the triggering by the operation clock signal, a first microwave signal generated by the microwave transceiver by using the first digital signal to generate a second microwave signal and transmit the second microwave signal to the sample chamber so as to excite a sample in the sample chamber to generate a third microwave signal that carries sample information. The conversion receiving unit 300 is further configured to receive the third microwave signal, convert the third microwave signal to a second digital signal that carries the sample information and return the second digital signal to the control unit 200 such that the control unit 200 transmits the second digital signal to the host computer, for the host computer to obtain the sample information.

In a case that the control device is in the continuous wave mode, the control unit 200 controls the conversion receiving unit 300 to generate a reference signal and controls the microwave transceiver to transmit the first microwave signal to the sample chamber to excite the sample in the sample chamber to generate a fourth microwave signal that carries sample information. The conversion receiving unit 300 is further configured to receive the fourth microwave signal modulated by the reference signal, convert the fourth microwave signal modulated by the reference signal to a third digital signal that carries the sample information and return the third digital signal to the control unit 200 such that the control unit 200 transmits the third digital signal to the host computer, for the host computer to obtain the sample information.

The control unit 200 is arranged in a Field-Programmable Gate Array (FPGA).

Specifically, the control unit 200 processing the first microwave signal generated by the microwave transceiver by using the first digital signal normally includes steps of converting the first digital signal into a baseband signal through digital-to-analog conversion and modulating the baseband signal and the first microwave signal to generate the second microwave signal. The above process is only a normal process of processing the first microwave signal by using the first digital signal, but is not a limiting in the present disclosure and may be used depending on actual conditions.

It should be noted that in the conventional technology, the host computer is connected to a waveform generation unit, a communication control unit 200 and a data acquisition unit of the control device. The waveform generation unit, the communication control unit 200 and the data acquisition unit are provided with clock signals from their own internal clock sources 100, and output microwave signals in the continuous wave mode or the pulse mode to the sample chamber under control of the control instruction transmitted by the host computer. Furthermore, the electron paramagnetic resonance spectrometer under control of the control device according to the conventional technology only outputs one or a few types of microwave signals with fixed phases, amplitudes and frequencies. Users can not adjust the phase, the amplitude and the frequency of the outputted microwave signal according to actual experimental or work requirements, and thus has low freedom.

However, in the embodiment, the clock source 100 is configured to generate the clock signal. The control unit 200 is configured to receive waveform data and a control instruction which are transmitted by the host computer and receive the clock signal, generate an operation clock signal based on the clock signal, and select a preset operation mode of the control device according to the control instruction, where the preset operation mode includes a continuous wave mode and a pulse mode. In a case that the control device is in the pulse mode, the control unit 200 generates a first digital signal based on the waveform data transmitted by the host computer in response to triggering by the operation clock signal. The conversion receiving unit 300 is configured to receive the first digital signal, and process, in response to the triggering by the operation clock signal, a first microwave signal generated by the microwave transceiver by using the first digital signal to generate a second microwave signal and transmit the second microwave signal to the sample chamber so as to excite a sample in the sample chamber to generate a third microwave signal that carries sample information. The conversion receiving unit 300 is further configured to receive the third microwave signal, convert the third microwave signal to a second digital signal that carries the sample information and return the second digital signal to the control unit 200 such that the control unit 200 transmits the second digital signal to the host computer, for the host computer to obtain the sample information. In a case that the control device is in the continuous wave mode, the control unit 200 controls the conversion receiving unit 300 to generate a reference signal and controls the microwave transceiver to transmit a first microwave signal to the sample chamber to excite the sample in the sample chamber to generate a fourth microwave signal that carries sample information. The conversion receiving unit 300 is configured to receive the fourth microwave signal modulated by the reference signal, convert the fourth microwave signal modulated by the reference signal to a third digital signal that carries the sample information and return the third digital signal to the control unit 200 such that the control unit 200 transmits the third digital signal to the host computer, for the host computer to obtain the sample information. It can be known from the above operation process that the control unit 200 generates the operation clock signal through the same clock source. The control unit 200 and the conversion receiving unit 300 control the electron paramagnetic resonance spectrometer in response to triggering by the operation clock signals from the same clock source. Since the operation clock signals from the same clock source are highly synchronized, the control device has higher synchronization than an electron paramagnetic resonance spectrometer including multiple separated clock sources 100 according to the conventional technology. A higher synchronization of the control device leads to a higher temporal resolution of a pulse width and a pulse relative delay of the second microwave signal in the form of the pulse generated by the electronic paramagnetic resonance spectrometer.

Moreover, the control device provided according to the embodiment of the present disclosure may receive waveform data transmitted by the host computer and generate the first microwave signal based on the waveform data, which allows a use to write arbitrary waveform data within a certain bandwidth range in a time domain. This indicates that the phase, amplitude and frequency of the finally generated first microwave signal can be controlled in real time. The first microwave signal generated by the microwave transceiver is modulated with the arbitrary waveform data serving as the baseband signal so as to achieve real-time rapid modulation of the amplitude, the phase and the frequency of the first microwave signal. Therefore, the amplitude, the phase and the frequency of the first microwave signal can be obtained by the user inputting different waveform data through the host computer, which meets different experiment or operation requirements of the users and increases the freedom of the users.

It should be further noted that in the embodiment, since the host computer is required to transmit the waveform data to the control unit 200, a high-speed data transmission interface needs to be provided between the control unit 200 and the host computer so as to meet a transmission requirement of the waveform data. Compared with the waveform data, the control instruction has a lower requirement on a data transmission speed. As long as the transmission requirement of the waveform data is met, the transmission requirement of the control instruction can be met. In an embodiment of the present disclosure, the host computer is connected to the control unit 200 via a serial data interface. In another embodiment of the present disclosure, the host computer is connected to the control unit 200 via a parallel data interface. In a preferred embodiment of the present disclosure, the host computer is connected to the control unit 200 via a USB data interface. The data interface is not limited in the present disclosure and can be determined based on actual conditions.

Furthermore, a Field Programmable Gate Array (FPGA) is a hardware re-programmable chip. Re-programming of the FPGA means not only that functions of internal logic units can be reconfigured in the field, but also that I/O pins and operation clock distribution of the FPGA can be redefined. Therefore FPGA based control device for a magnetic resonance spectrometer have advantages of low cost, high integration, flexible configuration and the like. The clock source 100 in the FPGA may provide a clock signal for the control device. In other embodiments of the present disclosure, the clock source 100 is not integrated in the same FPGA as the control unit 200, but is arranged in other chips or devices, which is not limited in the present disclosure and depends on actual conditions.

In an embodiment of the present disclosure, the FPGA is of a SRAM type in a model of virtex-7. The FPGA of this model has advantages of high performance, fast speed and ability of reconfiguration. But in other embodiments of the present disclosure, the FPGA is of DRAM type. The specific type and model of the FPGA are not limited in the present disclosure and depend on actual conditions.

Based on the above embodiments, in an embodiment of the present disclosure, in a case that control device is in the pulse mode, the waveform data is pulse waveform data, the second microwave signal and the third microwave signal are pulse microwave signals.

After receiving the first digital signal, in response to triggering by the operation clock signal, the conversion receiving unit 300 processes a first microwave signal generated by the microwave transceiver by using the first digital signal to generate a second microwave signal in the form of the pulse microwave signal. The second microwave signal in the form of the pulse microwave signal excites a sample in the sample chamber to generate a third microwave signal in the form of the pulse microwave signal that carries sample information. The conversion receiving unit 300 receives the third microwave signal, converts the third microwave signal to a second digital signal that carries the sample information and returns the second digital signal to the control unit 200 such that the control unit 200 transmits the second digital signal that carries the sample information to the host computer, for the host computer to obtain the sample information.

Based on the above embodiments, in another embodiment of the present disclosure, the conversion receiving unit 300 includes a waveform conversion unit and a signal receiving unit.

In a case that the control device is in the pulse mode, the waveform conversion unit is configured to receive the first data signal, and process, in response to triggering by the operation clock signal, a first microwave signal generated by the microwave transceiver by using the first digital signal to generate a second microwave signal. The second microwave signal excites a sample in the sample chamber to generate a third microwave signal that carries the sample information.

The signal receiving unit is configured to receive the third microwave signal in the form of the pulse microwave signal, convert the third microwave signal to a second digital signal that carries the sample information and return the second digital signal to the control unit 200 such that the control unit 200 transmits the second digital signal that carries the sample information to the host computer, for the host computer to obtain the sample information.

Based on the above embodiments, in another embodiment of the present disclosure, the control device further includes a control clock management unit.

The control clock management unit is configured to receive the operation clock signal outputted from the control unit 200, adjust a frequency and a drive capability of the operation clock signal, and transmit the adjusted operation clock signal to the waveform conversion unit and the signal receiving unit.

It should be noted that in the embodiment, the control clock management unit is arranged for the purpose of central management of the operation clock signal outputted from the control unit 200.

Based on the above embodiments, in another embodiment of the present disclosure, in a case that the control device is in the continuous wave mode, the fourth microwave signal is a continuous microwave signal.

Based on the above embodiments, in another embodiment of the present disclosure, the conversion receiving unit 300 includes a waveform conversion unit and a signal receiving unit.

In a case that the control device is in the continuous wave mode, the microwave transceiver transmits the continuous microwave signal to the sample chamber. The continuous microwave signal excites a sample in the sample chamber to generate the fourth microwave signal in the form of the continuous microwave signal that carries the sample information.

The signal receiving unit transmits a reference signal under control of the control unit. The signal receiving unit is configured to receive the fourth microwave signal in the form of the continuous microwave signal that is modulated by the reference signal and carries the sample information, convert the fourth microwave signal to a third digital signal that carries the sample information and return the third digital signal to the control unit 200 such that the control unit 200 transmits the third digital signal that carries the sample information to the host computer, for the host computer to obtain the sample information.

Based on the above embodiments, in another preferred embodiment of the present disclosure, the control device further includes a storage unit, and the preset operation mode further includes a storage mode.

In a case that the control device is in the storage mode, the control unit 200 transmits the waveform data transmitted by the host computer to the storage unit for storage.

It should be noted that the storage unit is arranged for the purpose of storing commonly used waveform data in the storage unit in advance when the control device operates, to avoid transmitting the waveform data from the host computer to the control device each time, thereby simplifying an operation process of the control device. In a case that the control device is in the storage mode, the host computer transmits the waveform data and a control instruction to the control unit 200. The control instruction includes a storage address. The control unit 200 stores the waveform data to the storage unit at the storage address. Since a process of storing data to a memory based on the storage address is known to those skilled in the art, the process is not described in the present disclosure.

In the embodiment, a memory model of the storage unit is DDR3. And in other embodiments of the present disclosure, a memory model of the storage unit is DDR4. The specific type of the memory specification of the storage unit is not limited in the present disclosure as long as rapid storage and fast reading of data can be realized, which depends on actual conditions.

Based on the above embodiments, in another preferred embodiment of the present disclosure, in a case that the control device is in the pulse mode, the control unit 200 is configured to read the waveform data transmitted by the host computer from the storage unit and process the waveform data to generate the first digital signal.

Based on the above embodiments, in another preferable embodiment of the present disclosure, the microwave transceiver has a microwave switch, and the preset operation mode further includes a square wave mode.

In a case that the control device is in the square wave mode, the control unit 200 generates a first square wave signal based on the waveform data transmitted by the host computer in response to the triggering by the operation clock signal.

The conversion receiving unit 300 is configured to receive the first square wave signal and perform level adjustment on the first square wave signal to obtain the second square wave signal, and output the second square wave signal to the microwave switch of the microwave transceiver, so as to drive the microwave switch to generate a microwave pulse signal. The microwave pulse signal excites a sample in the sample chamber to generate the fourth microwave signal that carries the sample information. After receiving the fourth microwave signal, the signal receiving unit 300 converts the fourth microwave signal to a fourth digital signal that carries the sample information and returns the fourth digital signal to the control unit 200 such that the control unit 200 transmits the fourth digital signal that carries the sample information to the host computer, for the host computer to obtain the sample information.

It should be noted that the second square signal is used to control switching states of the microwave switch. When the second square wave signal is at a high level, the microwave switch is switched on, to allow the first microwave signal transmitted by the microwave transceiver to pass. When the second square wave signal is at a low level, the microwave switch is switched off, to not allow the first microwave signal transmitted by the microwave transceiver to pass, thereby realizing modulating of the first microwave signal to generate a microwave square wave signal. However, in other embodiments of the present disclosure, the microwave switch may be switched on when the second square wave signal is at the low level to allow the first microwave signal transmitted by the microwave transceiver to pass, and the microwave switch is switched off when the second square wave signal is at the high level, to not allow the first microwave signal transmitted by the microwave transceiver to pass. The user may adjust a duration of the second square wave signal at the high level or the low level to adjust a period of the microwave square wave signal.

It should be noted that in the embodiment, the microwave pulse signal may be applied to scenarios without requirements on fast modulation of the amplitude, the phase and the frequency. In addition, the control unit 200 performs parallel-serial conversion on the waveform data transmitted by the host computer to realize multiple of the data rate. In addition, delay processing is performed with a delay chain technology, so that the temporal resolution of the microwave square wave signal can reach an order of 50 ps, which is higher than that of the microwave square wave signal outputted in an arbitrary wave mode. Since the method of performing the delay processing on the square wave with the delay chain technology is well known to those skilled in the art, a specific process and a principle of the method are not described in the present disclosure.

Figure 2:
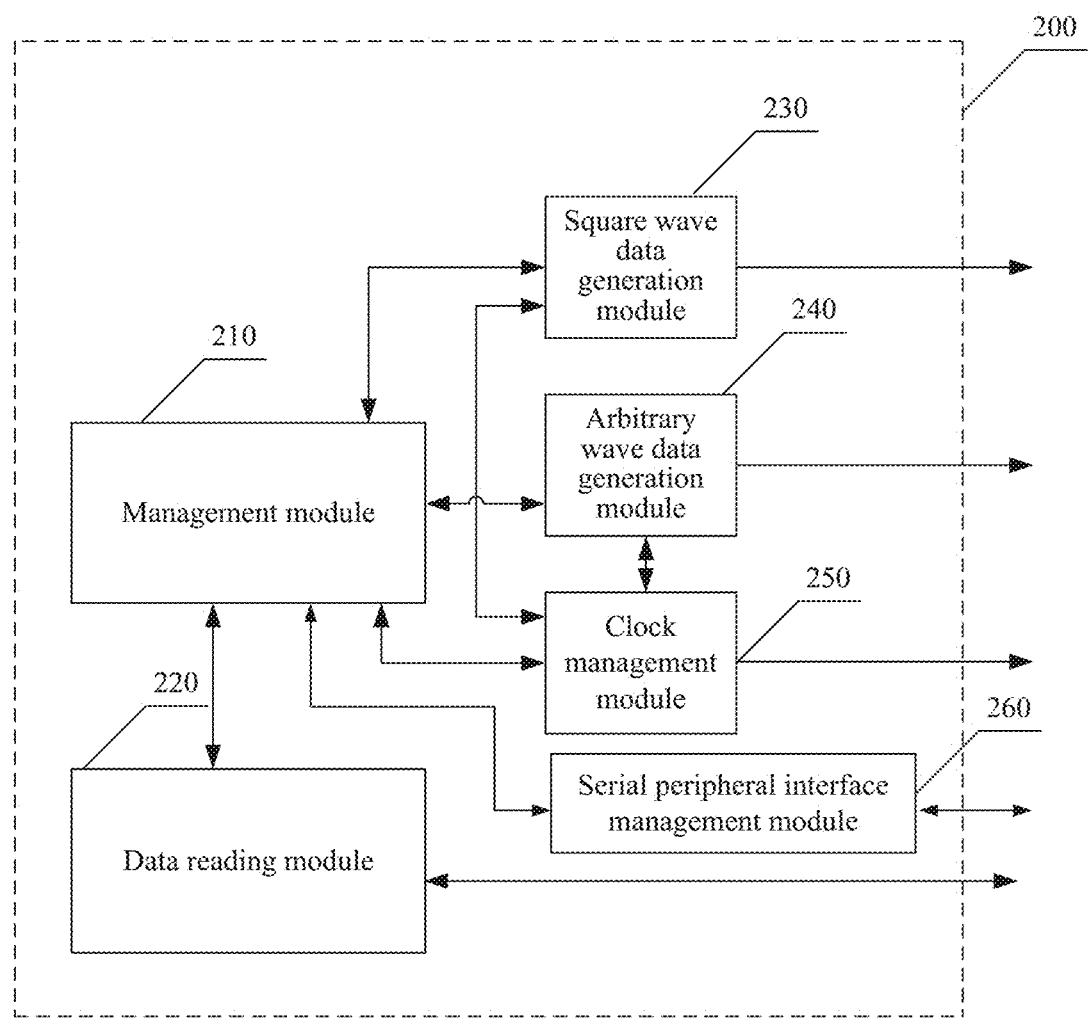
FIG. 2 is a schematic structural diagram of a control unit according to an embodiment of the present disclosure.

Based on the above embodiments, in a specific embodiment of the present disclosure, as shown in FIG. 2, the control unit 200 includes a management module 210, a square wave data generation module 230, an arbitrary wave data generation module 240, a clock management module 250, a data reading module 220 and a serial peripheral interface management module 260.

The clock management module 250 is configured to receive a clock signal generated by the clock source, and generate an operation clock signal based on the clock signal. The operation clock signal includes a system operation clock signal, a data rate doubling clock signal and a reference clock signal.

The management module 210 is configured to receive waveform data and a control instruction which are transmitted by the host computer and select a preset operation mode of the control device according to the control instruction, where the preset operation mode includes a continuous wave mode, a pulse mode, a storage mode and a square wave mode.

In a case that the control device is in the storage mode, the management module 210 stores waveform data transmitted by the host computer to the storage unit at a storage address in the control instruction transmitted by the host computer. The waveform data includes original arbitrary wave data and original square wave data.

In a case that the control device is in the pulse mode, the management module 210 reads the original arbitrary wave data from the storage unit and transmits the original arbitrary wave data to the arbitrary wave data generation module 240. The arbitrary wave data generation module 240 performs high-speed parallel-serial conversion on the original arbitrary wave data in response to triggering by the data rate doubling clock signal to obtain a first digital signal and transmit the first digital signal to the waveform conversion unit.

In a case that the control device is in the continuous wave mode, the management module 210 controls the conversion receiving unit 300 to generate a reference signal, through the data reading module 220 in response to triggering by the reference clock signal.

In a case that the control device is in the square wave mode, the management module 210 reads the original square wave data from the storage unit and transmits the original square wave data to the square wave data generation module 230. The square wave data generation module 230 performs high-speed parallel-serial conversion on the original square wave data in response to the triggering by the data rate doubling clock signal to realize double of the data rate, and performs the delay processing on the square wave data with the delay chain technology to obtain a first square wave signal, and transmit the first square wave signal to the conversion receiving unit 300.

The control instruction is transmitted to the conversion receiving unit 300 through the serial peripheral interface management module 260.

It should be noted that in the embodiment, in a case that the control device is in the storage mode, the management module 210 stores the waveform data transmitted by the host computer to the storage unit at the storage address in the control instruction transmitted by the host computer. In a case that the control device is in the pulse mode, the management module 210 reads the original arbitrary wave data from the storage unit based on address information in the control instruction transmitted by the host computer and transmits the original arbitrary wave data after a real-time processing to the high-speed parallel-serial conversion module in the management module 210 to be converted from parallel data to serial data so as to realize double of the data rate and obtain a first digital signal. Then, the first digital signal is transmitted to the conversion receiving unit 300 through I/O terminals with the double data rate of the FPGA. In a case that the control device is in the square wave mode, the management module 210 reads the original square wave data from the storage unit based on the address information in the control instruction transmitted by the host computer. After the original square wave data is decoded through internal logic of the FPGA, the square wave digital signal is transmitted to the high-speed parallel-serial conversion module in the FPGA to be converted from the parallel data to the serial data so as to realize the double of the data rate. In addition, the delay processing is performed on the square wave digital signal by using the delay chain technology to obtain the first square wave signal. The first square wave signal is transmitted to the conversion receiving unit 300.

It should be further noted that in order to meet signal integrity of an internal logic design of the FPGA in the case of high-speed data transmission, layout and wiring of the above logic units are designed under constraint conditions for a low-level design of the FPGA, so as to align an output time of the parallel data and ensure correctness of signal output.

Figure 3:
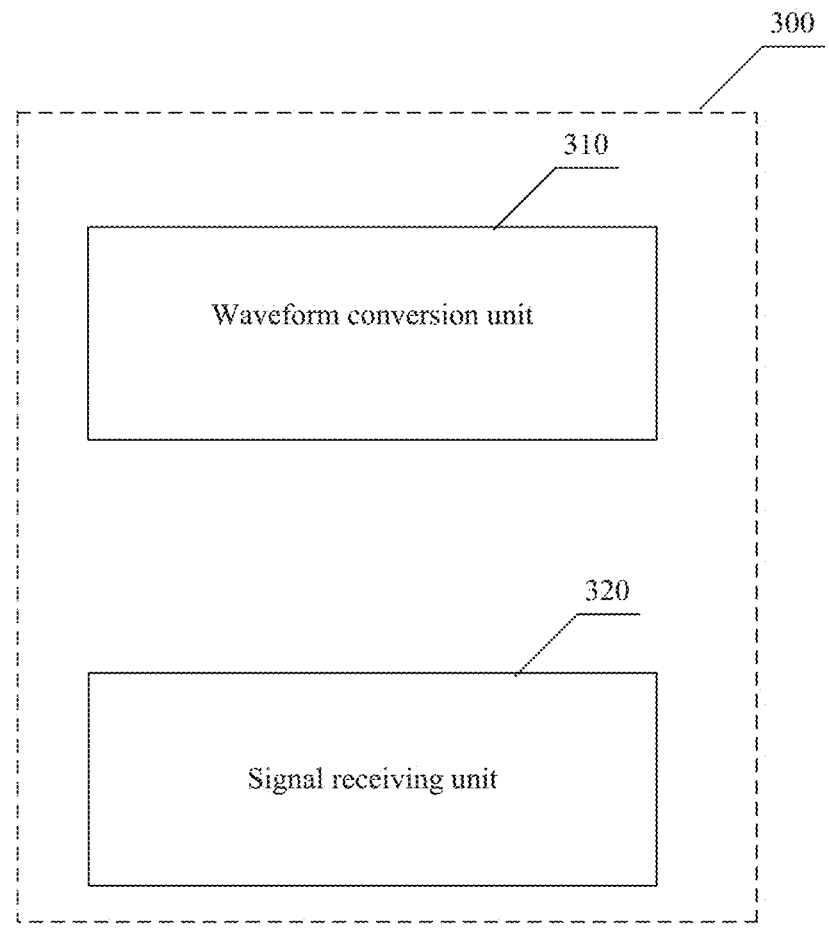
FIG. 3 is a schematic structural diagram of a conversion receiving unit according to an embodiment of the present disclosure.
Figure 4:
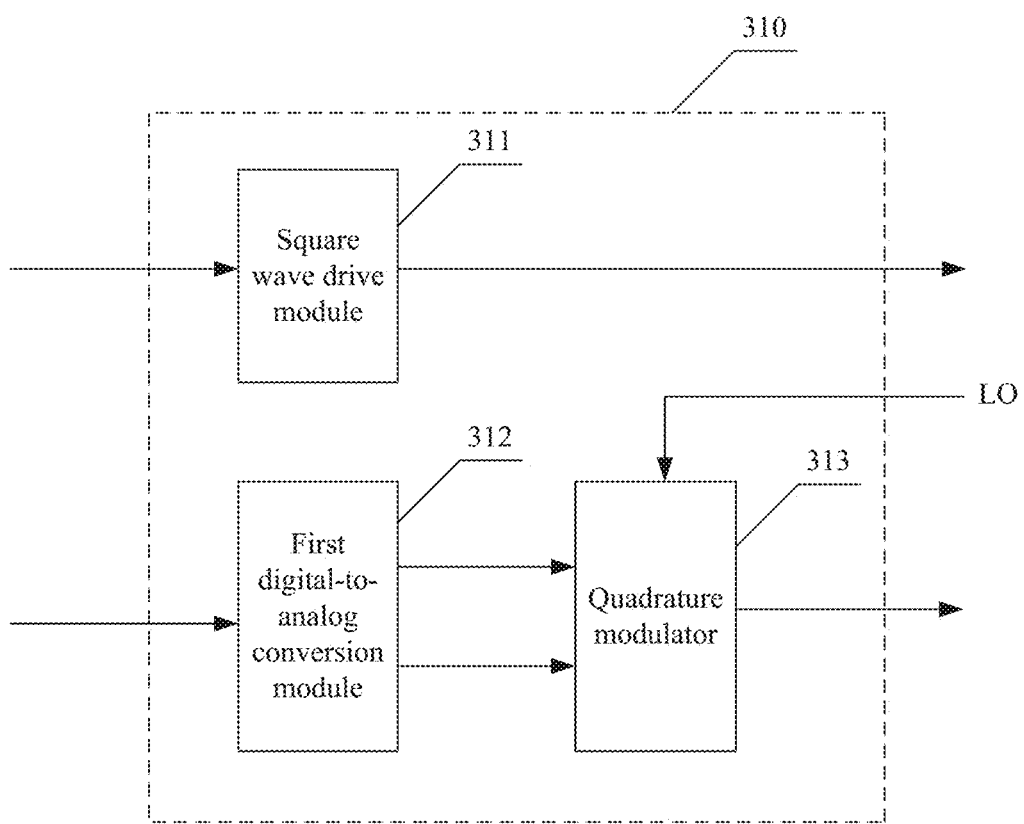
FIG. 4 is a schematic structural diagram of a waveform conversion unit according to an embodiment of the present disclosure.

Based on the above embodiments, in an embodiment of the present disclosure, as shown in FIG. 3, the conversion receiving unit 300 includes a waveform conversion unit 310 and a signal receiving unit 320. As shown in FIG. 4, the waveform conversion unit 310 includes a square wave drive module 311, a first digital-to-analog conversion module 312 and a quadrature modulator 313.

The square wave drive module 311 is configured to, in a case that the control device is in the square wave mode, receive the first square wave signal and adjust the level of the first square wave signal to obtain a second square wave signal meeting a requirement of driving the microwave switch. The second square wave signal is used to drive the microwave switch to generate a microwave square wave signal.

The first digital-to-analog conversion module 312 is configured to, in a case that the control device is in the pulse mode, receive the first digital signal, process the first digital signal to obtain a first sub-signal and a second sub-signal in response to triggering by a system operation clock, and transmit the first sub-signal and the second sub-signal to the quadrature modulator 313.

The quadrature modulator 313 is configured to receive the first sub-signal, the second sub-signal and a first microwave signal LO transmitted by the microwave transceiver, perform modulation on the first sub-signal, the second sub-signal and the first microwave signal LO transmitted by the microwave transceiver to obtain the second microwave signal. The the second microwave signal is used to excite a sample in the sample chamber to generate the third microwave signal that carries the sample information.

Figure 5:
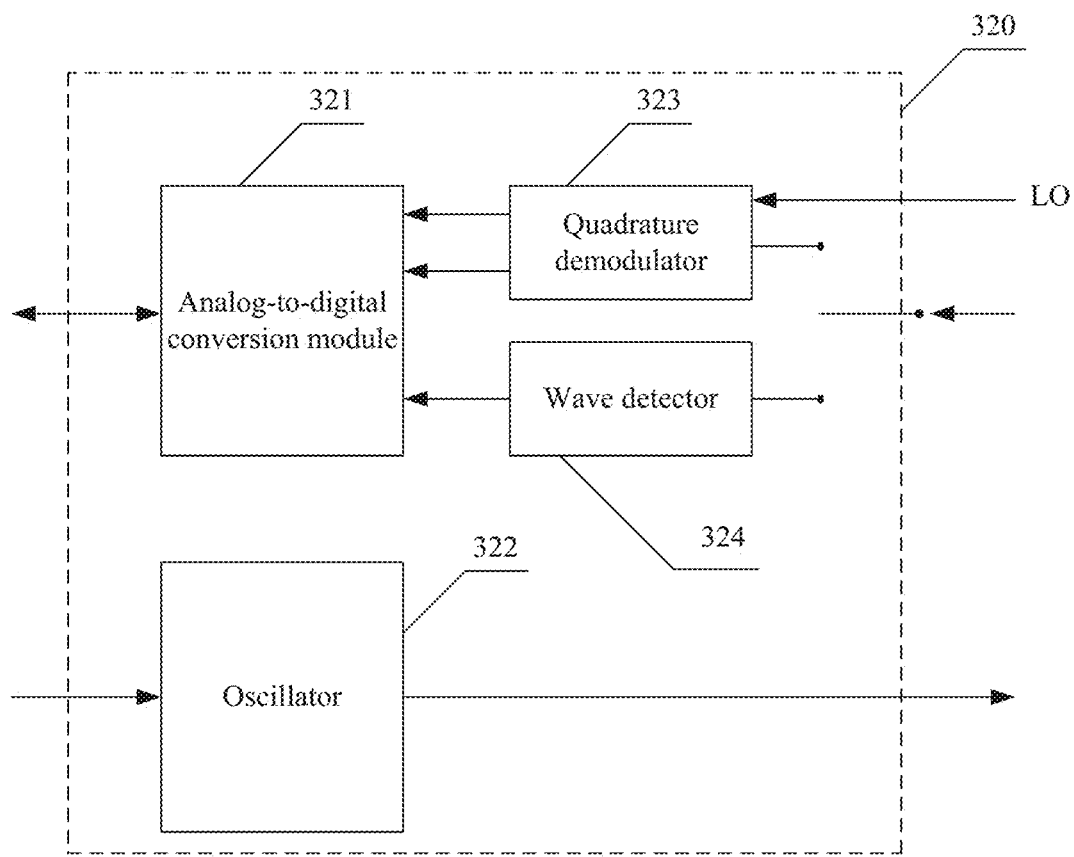
FIG. 5 is a schematic structural diagram of a signal receiving unit according to an embodiment of the present disclosure.

As shown in FIG. 5, the signal receiving unit 320 includes: an analog-to-digital conversion module 321, an oscillator 322, a quadrature demodulator 323 and a wave detector 324.

The oscillator 322 is configured to generate a reference signal under control of the control unit 200.

The wave detector 324 is configured to, in a case that the control device is in the continuous wave mode, receive a fourth microwave signal in the form of the continuous microwave signal that carries the sample information and is modulated by the reference signal, perform non-coherent demodulation on the fourth microwave signal to obtain a first analog signal in the form of the continuous microwave signal that carries the sample information, and transmit the first analog signal to the analog-to-digital conversion module 321.

The quadrature demodulator 323 is configured to, in a case that the control device is in the pulse mode, receive the third microwave signal in the form of the pulse wave signal that carries the sample information and is returned by the sample chamber, process the third microwave signal by using the first microwave signal LO transmitted by the microwave transceiver to obtain the first analog signal in the form of the pulse wave signal that carries the sample information, and transmit the first analog signal to the analog-to-digital conversion module 321.

The analog-to-digital conversion module 321 is configured to perform analog-to-digital conversion on the received signal to obtain the second digital signal or the third digital signal that carry the sample information in response to the triggering by the system operation clock, and transmit the second digital signal or the third digital signal to the analog/digital data management module 210.

Figure 6:
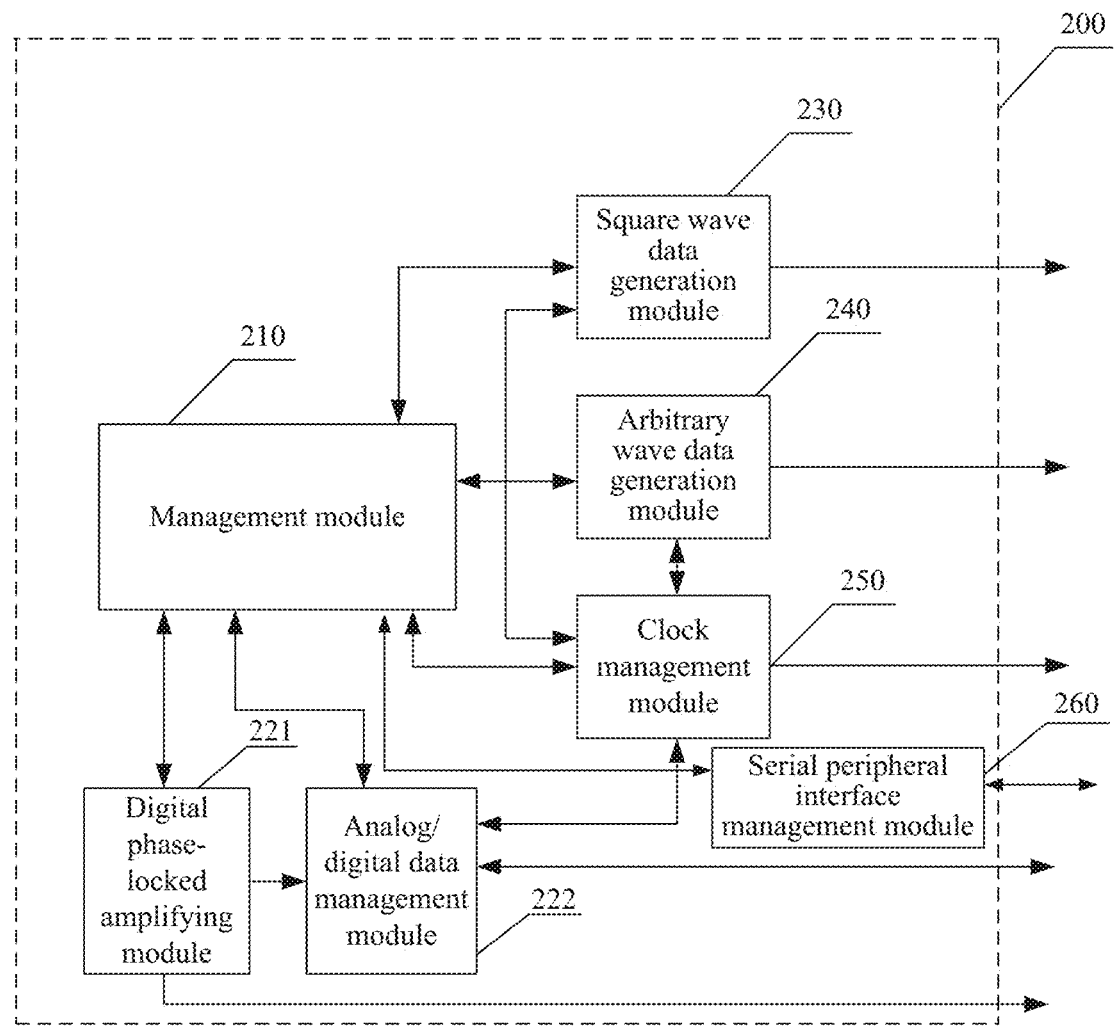
FIG. 6 is a schematic structural diagram of a control according to another embodiment of the present disclosure.

It should be noted that in the embodiment, as shown in FIG. 6, the data reading module 220 includes: a digital phase-locked amplifying module 221 and the analog/digital data management module 222.

The digital phase-locked amplifying module 221 is configured to, in a case that the control device is in the continuous wave mode, control the oscillator 322 to generate the reference signal in response to the triggering by the reference clock signal, receive the third digital signal that carries the sample information through the analog/digital data management module 222, process the third digital signal and transmit the processed third digital signal to the management module 210.

In a case that the control device is in the continuous wave mode, the analog/digital data management module 222 is configured to receive the third digital signal that carries the sample information and transmit the third digital signal to the digital phase-locked amplifying module 221. In a case that the control device is in the pulse mode, the analog/digital data management module 222 is configured to receive the second digital signal that carries the sample information, process the second digital signal and transmit the processed second digital signal to the management module 210.

It should be further noted that in the embodiment, the control unit 200 is connected to the host computer via a USB bus control unit 200. The storage unit adopts a DDR3 storage format. The management module includes a USB control module, a DDR3 management module 210 and a core management module 210.

The USB control module is configured to control data transmission between the host computer and the control unit 200. The DDR3 management module 210 is configured to manage the storage unit, read and store the waveform data according to the control instruction of the host computer. The core management module 210 performs other functions of the management module 210.

Figure 7:
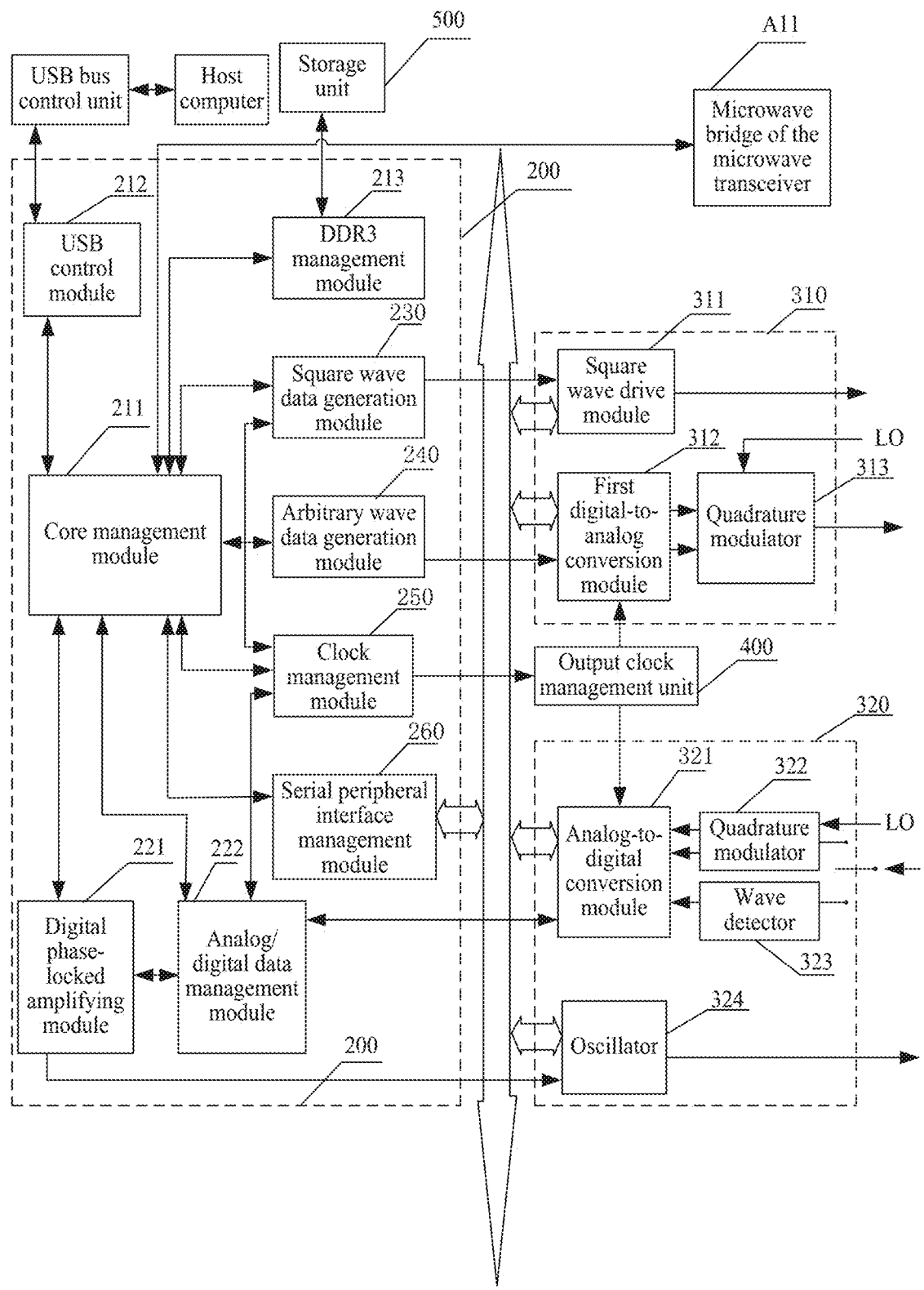
FIG. 7 is a schematic structural diagram of an FPGA based control device for a magnetic resonance spectrometer according to a preferred embodiment of the present disclosure.

Based on the above embodiments, in a preferred embodiment of the present disclosure, as shown in FIG. 7, the control device includes: a control unit 200, a waveform conversion unit 310, an output clock management unit 400 and a signal receiving unit 320. The control unit 200 includes a clock source 100.

The clock source 100 and the control unit 200 are integrated in the same FPGA. For convenience, the clock source 100 is not shown in FIG. 7.

The control unit 200 includes a management module 210, a square wave data generation module 230, an arbitrary wave data generation module 240, a clock management module 250, a data reading module 220 and a serial peripheral management module 260.

The clock management module 250 is configured to receive a clock signal generated by the clock source 100, and generate an operation clock signal based on the clock signal. The operation clock signal includes an system operation clock signal, a data rate doubling clock signal and a reference clock signal.

The management module 210 is configured to receive the waveform data and a control instruction which are transmitted by the host computer and select a preset operation mode of the control device according to the control instruction, where the preset operation mode includes a continuous wave mode, a pulse mode, a storage mode and a square wave mode.

In a case that the control device is in the storage mode, the management module 210 stores the waveform data transmitted by the host computer to the storage unit 500 at a storage address in the control instruction transmitted by the host computer.

The waveform data includes original arbitrary wave data and original square wave data.

In a case that the control device is in the pulse mode, the management module 210 reads the original arbitrary wave data from the storage unit 500 and transmits the original arbitrary wave data to the arbitrary wave data generation module 240. The arbitrary wave data generation module 240 performs high-speed parallel-serial conversion on the original arbitrary wave data in response to triggering by the data rate doubling clock signal to realize double of a data rate so as to obtain a first digital signal, and transmit the first digital signal to the waveform conversion unit 310.

In a case that the control device is in the continuous wave mode, the management module 210 controls the oscillator 322 to generate a reference signal through the digital phase-locked amplifying module 221, in response to triggering by the reference clock signal through the data reading module 220.

In a case that the control device is in the square wave mode, the management module 210 reads the original square wave data from the storage unit 500 and transmits the original square wave data to the square wave data generation module 230. The square wave data generation module 230 performs high-speed parallel-serial conversion on the original square wave data in response to the triggering by the data rate doubling clock signal to realize double of the data rate, performs the delay processing on the square wave data with the delay chain technology to obtain a first square wave signal, and transmit the first square wave signal to the conversion receiving unit 300.

The control instruction is transmitted to the waveform conversion unit 310 and the signal receiving unit 320 through the serial peripheral interface management module 260.

The waveform conversion unit 310 includes a square wave drive module 311, a first digital-to-analog conversion module 312 and a quadrature modulator 313.

The square wave drive module 311 is configured to, in a case that the control device is in the square wave mode, receive the first square wave signal and adjust the level of the first square wave signal to obtain a second square wave signal meeting a requirement of driving the microwave switch. The second square wave signal is used to drive the microwave switch to generate a microwave square wave signal.

The first digital-to-analog conversion module 312 is configured to, in a case that the control device is in the pulse mode, receive the first digital signal, process the received first digital signal to obtain a first sub-signal and a second sub-signal in response to triggering by a system operation clock, and transmit the first sub-signal and the second sub-signal to the quadrature modulator 313.

The quadrature modulator 313 is configured to receive the first sub-signal, the second sub-signal and a first microwave signal LO transmitted by the microwave transceiver, perform modulation on the first sub-signal, the second sub-signal and the first microwave signal LO transmitted by the microwave transceiver to obtain the second microwave signal. The second microwave signal is used to excite a sample in the sample chamber to generate the third microwave signal that carries the sample information.

The wave detector 324 is configured to, in a case that the control device is in the continuous wave mode, receive a fourth microwave signal in the form of the continuous microwave signal that carries the sample information and is modulated by the reference signal, perform non-coherent demodulation on the fourth microwave signal to obtain a first analog signal in the form of the continuous microwave signal that carries the sample information, and transmit the first analog signal to the analog-to-digital conversion module 321.

The quadrature demodulator 323 is configured to, in a case that the control device is in the pulse mode, receive a third microwave signal in the form of the pulse wave signal that carries the sample information, process the third microwave signal by using the first microwave signal LO transmitted by the microwave transceiver to obtain the first analog signal in the form of the pulse wave signal that carries the sample information, and transmit the first analog signal to the analog-to-digital conversion module 321.

The analog-to-digital conversion module 321 is configured to perform analog-to-digital conversion on the received signal to obtain the second digital signal that carry the sample information in response to the triggering by the system operation clock, and transmit the second digital signal to the analog/digital data management module 222.

The output clock management unit 400 is connected to the clock management module 250 and is configured to receive the system operation clock signal and provides the system operation clock signal for the waveform conversion unit 310 and the signal receiving unit 320.

In the embodiment, the data reading module 220 includes: a digital phase-locked amplifying module 221 and an analog/digital data management module 222.

The digital phase-locked amplifying module 221 is configured to, in a case that the control device is in the continuous wave mode, control the oscillator 322 to generate the reference signal in response to the triggering by the reference clock signal, receive the second digital signal that carries the sample information through the analog/digital data management module 222, process the second digital signal and transmit the second digital signal to the management module 210.

In a case that the control device is in the continuous wave mode, the analog/digital data management module 222 is configured to receive the second digital signal that carries the sample information and transmit the second digital signal to the digital phase-locked amplifying module 221. In a case that the control device is in the pulse mode, the analog/digital data management module 222 is configured to receive the second digital signal that carries the sample information and transmit the second digital signal to the management module 210.

It should be further noted that in the embodiment, the control unit 200 is connected to the host computer via a USB bus control unit 200. The storage unit adopts a DDR3 storage format. The management module includes a USB control module, a DDR3 management module 210 and a core management module 210.

The USB control module is configured to control data transmission between the host computer and the control unit 200. The DDR3 management module 210 is configured to manage the storage unit 500, read and store the waveform data according to the control instruction of the host computer. The core management module 210 is connected to a microwave bridge A11 of the microwave transceiver so as to control the microwave transceiver, and perform other functions of the management module 210.

Correspondingly, an electron paramagnetic resonance spectrometer is further provided according to the embodiment of the present disclosure, which includes at least one control device according to any one of the above embodiments.

Correspondingly, a method for controlling an electron paramagnetic resonance spectrometer is further provided according to the embodiment of the present disclosure, which includes following steps 1 to 5.

In step 1, a host computer transmits a control instruction, an address and data to the control device for the electron paramagnetic resonance spectrometer, and an operation mode is selected. In a case that the control device is in a continuous wave mode, step 2 is performed, in a case that the control device is in a pulse mode, step 3 is performed, and in a case that the control device is in a transmission mode, step 4 is performed.

In step 2, an FPGA controls an analog-to-digital conversion module in the signal receiving unit through a serial bus control module in the control unit to process the acquired data through a digital phase-locked amplifying module in the control unit to obtain a sample signal in the form of the continuous wave. This process ends.

In step 3, the host computer transmits the control instruction to the control device for the electron paramagnetic resonance spectrometer to control waveform generation. Also, the host computer controls the signal receiving unit to acquire the signals, and obtains a sample signal in the form of the pulse wave through the ADC data management module in the control unit. This process ends.

In step 4, the host computer transmits a waveform address and waveform data to the control device for the electron paramagnetic resonance spectrometer.

In step 5, the FPGA receives the waveform address and the waveform data, obtains the waveform address by parsing, and stores the waveform data into a memory at the waveform address.

In summary, a magnetic resonance spectrometer and an FPGA based control device for a magnetic resonance spectrometer are provided according to the embodiments of the present disclosure. The control device includes: a control unit 200 and a conversion receiving unit 300. The control unit 200 includes a clock source 100. The clock source 100 is integrated in the control unit 200 which is configured to generate an operation clock signal based on a clock signal generated by the clock source 100 and receive waveform data and a control instruction transmitted by a host computer, select a preset operation mode of the control device according to the control instruction, where the preset operation mode includes a continuous wave mode and a pulse mode. In a case that the control device is in the pulse mode, the control unit 300 generates a first digital signal based on the waveform data transmitted by the host computer in response to triggering by the operation clock signal. The conversion receiving unit 300 is configured to receive the first digital signal, and process, in response to the triggering by the operation clock signal, a first microwave signal generated by the microwave transceiver by using the first digital signal to generate a second microwave signal and transmit the second microwave signal to the sample chamber so as to excite a sample in the sample chamber to generate a third microwave signal that carries sample information. The conversion receiving unit is further configured to receive the third microwave signal and convert the third microwave signal to a second digital signal that carries the sample information and return the second digital signal to the control unit 300 such that the control unit 300 transmits the second digital signal to the host computer, for the host computer to obtain the sample information. In a case that the control device is in the continuous wave mode, the control unit 300 controls the conversion receiving unit 300 to generate a reference signal and controls the microwave transceiver to transmit a first microwave signal to the sample chamber to excite the sample in the sample chamber to generate a fourth microwave signal that carries sample information. The conversion receiving unit 300 is configured to receive the fourth microwave signal modulated by the reference signal, convert the fourth microwave signal modulated by the reference signal to a third digital signal that carries the sample information and return the third digital signal to the control unit 300 such that the control unit 300 transmits the third digital signal to the host computer, for the host computer to obtain the sample information. It can be known from the above operation process that the control unit 300 generates the operation clock signals through the same clock source 100. The control unit 300 and the conversion receiving unit 300 control the electron paramagnetic resonance spectrometer in response to triggering by the operation clock signals from the same clock source, Since the operation clock signals from the same clock source are highly synchronized, the control device has higher synchronization than an electron paramagnetic resonance spectrometer including multiple separated clock sources 100 according to the conventional technology. Under control of the control device, the second microwave signal in the form of pulse generated by the electronic paramagnetic resonance spectrometer has small minimum resolvable temporal widths of a pulse width and a pulse relative delay, that is, the second microwave signal has a high temporal resolution.

The embodiments of the present disclosure are described in a progressive manner, and each embodiment places emphasis on the difference from other embodiments. Therefore, for the same or similar parts between the embodiments, one may refer to the description of other embodiments.

According to the above description of the disclosed embodiments, those skilled in the art can implement or practice the present disclosure. Many changes to these embodiments are apparent for those skilled in the art, and general principles defined herein may be implemented in other embodiments without departing from the spirit or scope of the present disclosure. Hence, the present disclosure is not limited to the embodiments disclosed herein, but is to conform to the widest scope in accordance with the principles and novel features disclosed herein.

The invention claimed is:

1. An FPGA based control device for a magnetic resonance spectrometer, applied to an electron paramagnetic resonance spectrometer, wherein the electron paramagnetic resonance spectrometer comprises: a host computer, a microwave transceiver and a sample chamber; the microwave transceiver comprises a microwave switch, the control device comprises:

a control unit comprising a clock source, and
a conversion receiving unit, wherein
the control unit is configured to receive waveform data and a control instruction which are transmitted by the host computer, generate an operation clock signal based on a clock signal generated by the clock source, and select a preset operation mode of the control device according to the control instruction, wherein the preset operation mode comprises one of a plurality of modes, the plurality of modes comprises one of a plurality of modes, the plurality of modes comprises a continuous wave mode and a pulse mode;
in a case that the control device is in the pulse mode, the control unit is configured to generate a first digital signal based on the waveform data transmitted by the host computer in response to triggering by the operation clock signal, the conversion receiving unit is configured to receive the first digital signal; the conversion receiving unit is further configured to process, in response to the triggering by the operation clock signal, a first microwave signal generated by the microwave transceiver by using the first digital signal to generate a second microwave signal, and transmit the second microwave signal to the sample chamber to excite a sample in the sample chamber to generate a third microwave signal that carries sample information; the conversion receiving unit is further configured to receive the third microwave signal, convert the third microwave signal to a second digital signal that carries the sample information, and return the second digital signal to the control unit, the control unit is further configured to transmit the second digital signal to the host computer, for the host computer to obtain the sample information;
in a case that the control device is in the continuous wave mode, the control unit is configured to control the conversion receiving unit to generate a reference signal and control the microwave transceiver to transmit the first microwave signal to the sample chamber to excite the sample in the sample chamber to generate a fourth microwave signal that carries sample information, the conversion receiving unit is further configured to receive the fourth microwave signal modulated by the reference signal, convert the fourth microwave signal modulated by the reference signal to a third digital signal that carries the sample information, and return the third digital signal to the control unit, the control unit is configured to transmit the third digital signal to the host computer, for the host computer to obtain the sample information; and the control unit is arranged in a Field-Programmable Gate Array, FPGA, wherein the second microwave signal and the third microwave signal are pulse microwave signals in a case that the control device is in the pulse mode;

wherein the conversion receiving unit comprises a waveform conversion unit and a signal receiving unit, and in a case that the control device is in the pulse mode:

the waveform conversion unit is configured to receive the first digital signal, process the first microwave signal generated by the microwave transceiver by using the first digital signal to generate the second microwave signal in response to the triggering by the operation clock signal, wherein the second microwave signal excites the sample in the sample chamber to generate the third microwave signal that carries the sample information; and the signal receiving unit is configured to receive the third microwave signal in the form of the pulse microwave signal, convert the third microwave signal to the second digital signal that carries the sample information, and return the second digital signal to the control unit, wherein the control unit transmits the second digital signal that carries the sample information to the host computer, for the host computer to obtain the sample information; and wherein the control device further comprises a control clock management unit configured to receive the operation clock signal outputted from the control unit, adjust a frequency and a drive capability of the operation clock signal, and transmit the adjusted operation clock signal to the waveform conversion unit and the signal receiving unit.

2. The control device according to claim 1, wherein the fourth microwave signal is a continuous microwave signal in a case that the control device is in the continuous wave mode.

3. The control device according to claim 2, wherein the conversion receiving unit comprises: a waveform conversion unit and a signal receiving unit, and in a case that the control device is in the continuous wave mode, the microwave transceiver is configured to transmit a continuous microwave signal to the sample chamber, wherein the continuous microwave signal excites the sample in the sample chamber to generate the fourth microwave signal in the form of the continuous microwave signal that carries the sample information; and the signal receiving unit is configured to transmit the reference signal under control of the control unit, the signal receiving unit is configured to receive the fourth microwave signal in the form of the continuous microwave signal that carries the sample information and that is modulated by the reference signal, convert the fourth microwave signal to the third digital signal that carries the sample information, and return the third digital signal to the control unit, wherein the control unit transmits the third digital signal that carries the sample information to the host computer, for the host computer to obtain the sample information.

4. The control device according to claim 1, wherein the control device further comprises a storage unit, and the preset operation mode further comprises a storage mode; and in a case that the control device is in the storage mode, the control unit is configured to transmit the waveform data transmitted by the host computer to the storage unit for storage.

5. The control device according to claim 4, wherein the control unit is configured to read the waveform data transmitted by the host computer from the storage unit, and process the waveform data to generate the first digital signal, in a case that the control device is in the pulse mode.

6. The control device according to claim 1, wherein the plurality of modes further comprises a square wave mode, and in a case that the control device is in the square wave mode:

the control unit is configured to generate a first square wave signal based on the waveform data transmitted by the host computer in response to the triggering by the operation clock signal;

the conversion receiving unit is configured to receive the first square wave signal and perform level adjustment on the first square wave signal to obtain a second square wave signal, and output the second square wave signal to the microwave switch of the microwave transceiver, wherein the second square wave signal drives the microwave switch to generate a microwave pulse signal, and the microwave pulse signal excites the sample in the sample chamber to generate a fifth microwave signal that carries the sample information; and the signal receiving unit is configured to convert, after receiving the fifth microwave signal, the fifth microwave signal to a fourth digital signal that carries the sample information and return the fourth digital signal to the control unit, wherein the control unit transmits the fourth digital signal that carries the sample information to the host computer, for the host computer to obtain the sample information.

7. A magnetic resonance spectrometer, comprising:
at least one control device,
a host computer,
a microwave transceiver, and
a sample chamber, wherein
the microwave transceiver comprises a microwave switch,
the control device comprises a control unit and a conversion receiving unit, the control unit comprises a clock source,
the control unit is configured to receive waveform data and a control instruction which are transmitted by the host computer, generate an operation clock signal based on a clock signal generated by the clock source, and select a preset operation mode of the control device according to the control instruction, wherein the preset operation mode comprises one of a plurality of modes, the plurality of modes comprises a continuous wave mode and a pulse mode;

in a case that the control device is in the pulse mode, the control unit is configured to generate a first digital signal based on the waveform data transmitted by the host computer in response to triggering by the operation clock signal, the conversion receiving unit is configured to receive the first digital signal; the conversion receiving unit is further configured to process, in response to the triggering by the operation clock signal, a first microwave signal generated by the microwave transceiver by using the first digital signal to generate a second microwave signal, and transmit the second microwave signal to the sample chamber to excite a sample in the sample chamber to generate a third microwave signal that carries sample information; the conversion receiving unit is further configured to receive the third microwave signal, convert the third microwave signal to a second digital signal that carries the sample information, and return the second digital signal to the control unit, the control unit is further configured to transmit the second digital signal to the host computer, for the host computer to obtain the sample information;

in a case that the control device is in the continuous wave mode, the control unit is configured to control the conversion receiving unit to generate a reference signal and control the microwave transceiver to transmit the first microwave signal to the sample chamber to excite the sample in the sample chamber to generate a fourth microwave signal that carries sample information, the conversion receiving unit is further configured to receive the fourth microwave signal modulated by the reference signal, convert the fourth microwave signal modulated by the reference signal to a third digital signal that carries the sample information, and return the third digital signal to the control unit, the control unit is configured to transmit the third digital signal to the host computer, for the host computer to obtain the sample information; and the control unit is arranged in a Field-Programmable Gate Array, FPGA, wherein the second microwave signal and the third microwave signal are pulse microwave signals in a case that the control device is in the pulse mode;

wherein the conversion receiving unit comprises a waveform conversion unit and a signal receiving unit, and in a case that the control device is in the pulse mode:

the waveform conversion unit is configured to receive the first digital signal, process the first microwave signal generated by the microwave transceiver by using the first digital signal to generate the second microwave signal in response to the triggering by the operation clock signal, wherein the second microwave signal excites the sample in the sample chamber to generate the third microwave signal that carries the sample information; and the signal receiving unit is configured to receive the third microwave signal in the form of the pulse microwave signal, convert the third microwave signal to the second digital signal that carries the sample information, and return the second digital signal to the control unit, wherein the control unit transmits the second digital signal that carries the sample information to the host computer, for the host computer to obtain the sample information; and the control device further comprises: a control clock management unit configured to receive the operation clock signal outputted from the control unit, adjust a frequency and a drive capability of the operation clock signal, and transmit the adjusted operation clock signal to the waveform conversion unit and the signal receiving unit.

8. The magnetic resonance spectrometer according to claim 7, wherein the fourth microwave signal is a continuous microwave signal in a case that the control device is in the continuous wave mode.

9. The magnetic resonance spectrometer according to claim 8, wherein the conversion receiving unit comprises: a waveform conversion unit and a signal receiving unit, and in a case that the control device is in the continuous wave mode, the microwave transceiver is configured to transmit a continuous microwave signal to the sample chamber, wherein the continuous microwave signal excites the sample in the sample chamber to generate the fourth microwave signal in the form of the continuous microwave signal that carries the sample information; and the signal receiving unit is configured to transmit the reference signal under control of the control unit, the signal receiving unit is configured to receive the fourth microwave signal in the form of the continuous microwave signal that carries the sample information and that is modulated by the reference signal, convert the fourth microwave signal to the third digital signal that carries the sample information, and return the third digital signal to the control unit, wherein the control unit transmits the third digital signal that carries the sample information to the host computer, for the host computer to obtain the sample information.

10. The magnetic resonance spectrometer according to claim 7, wherein the control device further comprises a storage unit, and the preset operation mode further comprises a storage mode; and in a case that the control device is in the storage mode, the control unit is configured to transmit the waveform data transmitted by the host computer to the storage unit for storage.

11. The magnetic resonance spectrometer according to claim 10, wherein the control unit is configured to read the waveform data transmitted by the host computer from the storage unit, and process the waveform data to generate the first digital signal, in a case that the control device is in the pulse mode.

12. The magnetic resonance spectrometer according to claim 7, wherein the plurality of modes further comprises a square wave mode, and in a case that the control device is in the square wave mode:

the control unit is configured to generate a first square wave signal based on the waveform data transmitted by the host computer in response to the triggering by the operation clock signal;

the conversion receiving unit is configured to receive the first square wave signal and perform level adjustment on the first square wave signal to obtain a second square wave signal, and output the second square wave signal to the microwave switch of the microwave transceiver, wherein the second square wave signal drives the microwave switch to generate a microwave pulse signal, and the microwave pulse signal excites the sample in the sample chamber to generate a fifth microwave signal that carries the sample information; and the signal receiving unit is configured to convert, after receiving the fifth microwave signal, the fifth microwave signal to a fourth digital signal that carries the sample information and return the fourth digital signal to the control unit, wherein the control unit transmits the fourth digital signal that carries the sample information to the host computer, for the host computer to obtain the sample information.

\* \* \* \* \*